(12) United States Patent
O'Connell et al.

(10) Patent No.: US 9,647,620 B2
(45) Date of Patent: May 9, 2017

(54) ELECTRONIC DEVICE AND INTEGRATED CIRCUIT COMPRISING A GAIN CONTROL MODULE AND METHOD THEREFOR

(75) Inventors: Patrick Alan O'Connell, Aalborg Oest (DK); Niall McDermott, Limerick (IE); Frederick Carnegie Thompson, Limerick (IE)

(73) Assignee: MediaTek Pte Ltd., Solaris (SG)

( * ) Notice: Subject to any disclaimer, the term of this patent is extended or adjusted under 35 U.S.C. 154(b) by 1296 days.

(21) Appl. No.: 12/688,909

(22) Filed: Jan. 17, 2010

(65) Prior Publication Data

US 2011/0176693 A1 Jul. 21, 2011

(51) Int. Cl.
*H03G 3/00* (2006.01)

(52) U.S. Cl.
CPC ............ *H03G 3/002* (2013.01); *H03G 3/001* (2013.01)

(58) Field of Classification Search
USPC .......................................... 381/107
See application file for complete search history.

(56) References Cited

U.S. PATENT DOCUMENTS

| | | | | |
|---|---|---|---|---|
| 3,934,084 A | * | 1/1976 | Munson | H03G 3/32 381/57 |
| 4,297,527 A | * | 10/1981 | Pate | 381/107 |
| 5,808,575 A | * | 9/1998 | Himeno | H03M 1/0863 341/139 |
| 5,838,269 A | * | 11/1998 | Xie | 341/139 |
| 5,841,385 A | | 11/1998 | Xie | |
| 7,133,529 B2 | * | 11/2006 | Ura | 381/66 |
| 7,298,212 B2 | * | 11/2007 | Nodake | 330/279 |
| 7,472,289 B2 | * | 12/2008 | Rodriguez et al. | 713/300 |
| 2002/0076072 A1 | * | 6/2002 | Cornelisse | H03G 7/007 381/312 |
| 2008/0253585 A1 | | 10/2008 | Kawamura | |
| 2008/0253586 A1 | * | 10/2008 | Wei | H03G 3/3005 381/107 |
| 2009/0067615 A1 | * | 3/2009 | Strandberg | 379/406.01 |
| 2009/0252347 A1 | * | 10/2009 | Kakkeri et al. | 381/107 |

FOREIGN PATENT DOCUMENTS

| | | |
|---|---|---|
| CN | 1529409 A | 9/2004 |
| EP | 2 088 586 A1 | 8/2009 |
| JP | H09298431 A | 11/1997 |
| JP | 2003304132 A | 10/2003 |
| JP | 2003318674 A | 11/2003 |
| JP | 200641734 A | 2/2006 |
| JP | 2008103877 A | 5/2008 |
| JP | 2008193812 A | 8/2008 |
| TW | 355789 | 4/1999 |

* cited by examiner

*Primary Examiner* — Amir Etesam
(74) *Attorney, Agent, or Firm* — Optimus Patents US, LLC

(57) ABSTRACT

A method for controlling a gain applied to an audio signal. The method comprises applying a gain step to a gain setting at defined time intervals, and upon detection of at least one zero crossing point within the audio signal, applying the gain setting to a gain control signal for controlling the gain applied to the audio signal.

16 Claims, 5 Drawing Sheets

ELECTRONIC DEVICE AND INTEGRATED CIRCUIT COMPRISING A GAIN CONTROL MODULE AND METHOD THEREFOR

FIELD OF THE INVENTION

The field of this invention relates to a method for controlling gain applied to an audio signal. The invention is applicable to, but not limited to, a gain control module for controlling a gain applied to an audio signal, an integrated circuit device and an electronic device comprising such a gain control module, and a method therefor.

BACKGROUND OF THE INVENTION

In the field of electronic audio devices, when changing the gain at an output of, say, a speaker driver (or other audio device that changes gain in the analogue domain), it is necessary to change the gain at 'zero crossing points' within the audio signal, i.e. the (analogue sinusoidal) signal waveform changing from a positive value to a negative value and vice versa, in order to reduce distortion and avoid introduction of signal artefacts caused by gain changes during non-zero output currents.

FIG. 1 illustrates an example of a known technique 100 for controlling a gain of an audio signal. A required (requested) gain is illustrated at 110, which comprises an initial (hexadecimal) value of '0F', illustrated generally at 112. An audio signal output by the analogue audio device is illustrated at 120, and initially comprises a gain that is substantially equivalent to the requested gain value 112. A zero crossing detector (ZCD) gain is also illustrated generally at 130, and which also comprises an initial value that is equal to that of the requested gain, namely '0F', illustrated generally at 131.

At point 115, the value of the requested gain 110 is changed from '0F' to a (hexadecimal) value of '0B', illustrated generally at 117, thereby indicating that a change to the gain of the audio signal 120 is required. When a change of the requested gain 110 occurs, the ZCD gain 130 is incremented (or decremented, as required) every n zero crossing points detected in the audio signal 120, as illustrated at 132, 133, 134 and 135, until the ZCD gain 130 reaches the value of the requested gain 110. The gain of the audio signal 120 is incremented along with the ZCD gain 130. Specifically for the illustrated example, the ZCD gain 130 is incremented at every six zero crossing points that are detected in the audio signal 120, as illustrated generally at 140.

In this manner, gain changes to the audio signal 120 are made in single steps. Hence, if starting with a gain of, say, 0 dB, an increase to 12 dB may be implemented in six steps of 2 dB. For the illustrated example, gain changes are implemented every six zero crossing points, so in this example the gain increase from 0 dB to 12 dB would be implemented over thirty six zero crossing points. By ramping up the gain of the audio signal 120 in this manner, a sudden uncomfortable increase in 'loudness' experienced by a user is substantially avoided.

A problem with this known technique is that the ramp up/down time is primarily based on the number of zero crossing points per step (e.g. one step to every six crossing points). The time between zero crossing points is completely dependent upon the signal frequency, which may vary considerably, thereby resulting in significant variations in the ramp time depending upon the frequency of the signal, as illustrated below:

| Signal Frequency | Ramp Time (over 31 steps) |
| --- | --- |
| 200 Hz | 2.5 ms * 31 steps = 77.5 ms |
| 1 kHz | 0.5 ms * 31 steps = 15.5 ms |
| 20 kHz | 25 µs * 31 steps = 0.775 ms |

This inconsistency in the ramp up/down rate caused by the dependence on the signal frequency is undesirable, and in many circumstances unacceptable. For example, some DTMF (Dual-tone Multi-Frequency) specifications require that the audio signals are able to ramp up from mute to full volume within a limited period of time, which for lower frequency signals using this known technique is difficult to achieve. For example, if a 10 msec. ramp up time is required, and the time between zero crossings is 2 msec., the gain must be changed to the required value in five zero crossings. This forces a certain minimum gain step to be used in order to achieve the required gain increase within the available zero crossings. In addition, typically a common gain step has to be used by all frequencies, so very high frequency signals which have zero crossings occurring more frequently will have a very short ramp up time. Furthermore the discrepancy in the latency of the ramp up from mute to full volume is audibly noticeable.

An alternative technique for changing the gain of an output signal of analogue audio device, such as a speaker driver, is based on an adherence to an absolute ramp time for increasing/decreasing the gain, irrespective of the extent of the gain change or the frequency of the output signal. However, a technique that utilises an absolute ramp time for increasing/decreasing cannot be synchronised to zero crossings.

Thus, a need exists for an improved technique for controlling a gain applied to an audio signal, and method of operation therefor.

SUMMARY OF THE INVENTION

Accordingly, the invention seeks to mitigate, alleviate or eliminate one or more of the above mentioned disadvantages singly or in any combination. Aspects of the invention provide a gain control module for controlling a gain applied to an audio signal, an integrated circuit device and an electronic device comprising such a gain control module, and a method therefor, as described in the appended claims.

According to a first aspect of the invention, there is provided an integrated circuit comprising a gain control module for controlling a gain applied to an audio signal. The gain control module is arranged to apply a gain step to a gain setting at defined time intervals, and upon detection of at least one zero crossing point within the audio signal, apply the gain setting to a gain control signal for controlling the gain applied to the audio signal.

Thus, in one example of the invention, the ramp time for the gain setting may be made dependent upon the application of the gain step at defined time intervals. In particular, since the ramp time for the gain setting is substantially independent of the detection of zero crossing points within the audio signal, the ramp time for the gain setting is not dependent upon the frequency of the audio signal, and accordingly a substantially consistent ramp time may be achieved for the gain setting irrespective of the frequency of the audio signal.

According to an optional feature of the invention, the gain control module may be arranged to apply a gain step to the gain setting at time intervals comprising a defined, uniform duration. In this manner, the predictability of the gain ramp time may be made easier.

According to an optional feature of the invention, the gain control module may comprise timer circuitry, the timer circuitry being arranged, upon expiration thereof, to output a gain step signal. The gain control module may be arranged to apply a gain step to the gain setting, upon a gain step signal being output by the timer circuitry. The timer circuitry may comprise a counter arranged to receive as inputs: a clock signal and an indication of a gain step interval value. The counter may be further arranged to count at least one of: at least one rising edge and at least one falling edge of the received clock signal, and to output a gain step signal upon the number of counted edges of the received clock signal in reaching the gain step interval value.

According to an optional feature of the invention, the gain control module may comprise gain setting circuitry arranged to receive an indication of a required gain, the gain setting circuitry being further arranged, upon receipt of a gain step signal, to compare the gain setting to the required gain. If the gain setting is not equal to the required gain the gain control module may apply a gain step to the gain setting. The gain setting circuitry may be further arranged to receive as an input an indication of a gain step size value, and to apply a gain step to the gain setting comprising a step size that corresponds to the received gain step size value indication.

According to an optional feature of the invention, the gain control module may comprise hardware, firmware or software arranged to perform an output control function arranged to output a gain control signal for controlling the gain applied to the audio signal. The output control function may be further arranged to receive as inputs an indication of the gain setting and a zero crossing point detection signal, and upon a zero crossing point being detected within the audio signal, to apply the gain setting to the gain control signal. The output control function may be arranged to disregard zero crossing points occurring within a defined minimum time interval since a previously regarded zero crossing point. For example, the output control function may be arranged to disregard zero crossing points occurring within a defined minimum time interval, since a previously regarded zero crossing point such that zero crossing points resulting from a signal comprising a frequency outside an audio range are disregarded.

According to an optional feature of the invention, if no zero crossing points are detected over a defined period of time, the gain control module may be arranged to apply a gain step to the gain control signal at defined time intervals. For example, the gain control module may comprise an output control function arranged, upon expiration of a zero crossing point detection timer, to apply the gain setting directly to the gain control signal, without waiting for a zero crossing point to be detected According to an optional feature of the invention, the gain control module may be arranged, upon receipt of a bypass signal, to apply a required gain directly to the gain control signal. For example the gain control module may comprise an output control function arranged to receive a bypass signal and an indication of the required gain, and upon receipt of the bypass signal, to apply the required gain to the gain control signal.

According to an optional feature of the invention, the audio signal may comprise a differential signal, and the gain control module may comprise a comparator arranged to receive as an input the differential audio signal, perform a comparison of the differential components of the audio signal, and output an indication of a detected zero crossing point upon a change in polarity of the result of the comparison between the differential components of the audio signal.

According to an optional feature of the invention, the gain control module may be arranged to control gain applied to a plurality of audio signals.

According to a second aspect of the invention, there is provided an electronic device comprising a gain control module for controlling a gain applied to an audio signal. The gain control module is arranged to apply a gain step to a gain setting at defined time intervals, and upon detection of at least one zero crossing point within the audio signal, apply the gain setting to a gain control signal for controlling the gain applied to the audio signal.

According to a third aspect of the invention, there is provided a method for controlling a gain applied to an audio signal. The method comprises applying a gain step to a gain setting at defined time intervals, and upon detection of at least one zero crossing point within the audio signal, applying the gain setting to a gain control signal for controlling the gain applied to the audio signal.

According to a fourth aspect of the invention, there is provided a computer program product comprising executable program code for configuring signal processing functionality of an electronic device. The program code is operable for: applying a gain step to a gain setting at defined time intervals, and upon detection of at least one zero crossing point within the audio signal, applying the gain setting to a gain control signal for controlling the gain applied to the audio signal.

According to a fifth aspect of the invention, there is provided a method for controlling a gain applied to an audio signal. The method comprises adjusting the gain applied to the audio signal, wherein adjustment is applied at zero crossing points within the audio signal, and amount of the adjustment is non-uniform.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Examples of the invention will be described in terms of a gain control circuit for controlling a voltage gain (or attenuation) applied to an audio signal within an electronic device, such as a wireless communication unit. However, it will be appreciated by a skilled artisan that the inventive concept herein described may be embodied in any type of audio gain control system. Furthermore, it will also be appreciated by a skilled artisan that the inventive concept herein described may be embodied in any type of audio gain control circuitry that uses a current gain (or attenuation) applied to an audio signal within an electronic device.

In a number of applications, the adaptation of gain control module in accordance with the examples of the invention described herein effectively performs a method for controlling a gain applied to an audio signal. The method comprises applying a gain step to a gain setting at defined time intervals, and upon detection of at least one zero crossing point within the audio signal, applying the gain setting to a gain control signal for controlling the gain applied to the audio signal. For clarity, the term 'zero crossing point' refers to that part of a signal waveform where the waveform changes from a positive value to a negative value and vice versa.

In this manner, the ramp time for the gain setting is made dependent upon the application of the gain step at defined time intervals. In particular, since the ramp time for the gain setting is substantially independent of the detection of zero crossing points within the audio signal, the ramp time for the gain setting is advantageously made independent of the frequency of the audio signal. Accordingly, a substantially consistent ramp time may be achieved for the gain setting, irrespective of the frequency of the audio signal. The gain setting is then applied to the gain control signal when a zero crossing point is detected within the audio signal, in order to reduce distortion and avoid signal artefacts caused by gain changes during non-zero output currents.

Accordingly, whilst the ramp profile for the gain control signal may not comprise a substantially straight line, due say to discrepancies between the timings of gain steps applied to the gain setting and the detection of zero crossing points, an averaged ramp time for the gain control signal will be approximately equal to that of the gain setting. Typically, the ramp time for the gain control signal will differ from the ramp time for the gain setting by no more than a single zero crossing period for the audio signal. Thus, gain changes may be applied to the audio signal at zero crossing points within a predictably consistent ramp time that is, for the most part, independent of the frequency of the audio signal.

Figure 2:
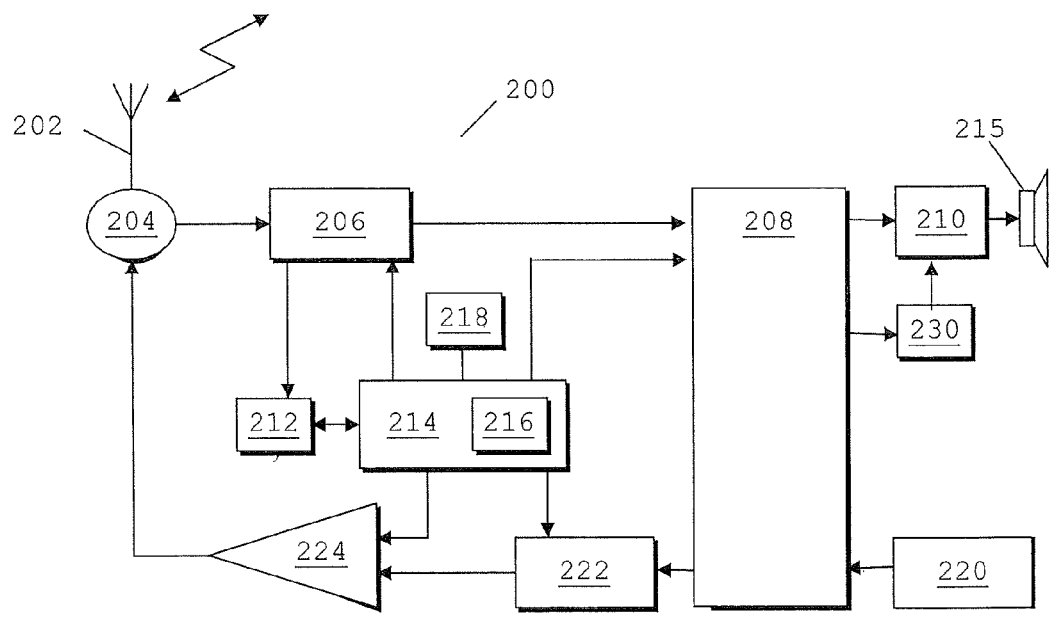
FIG. 2 illustrates an example of a functional block diagram of an electronic device.

Referring first to FIG. 2, an example of a functional block diagram of an electronic device, is shown in accordance with one example embodiment of the present invention. For the illustrated example, the electronic device is in a form of a wireless communication unit 200, such as a mobile telephone handset, sometimes referred to as a mobile subscriber unit (MS) in the context of cellular communications or a user equipment (UE) in terms of a $3^{rd}$ generation partnership project (3GPP) communication system. The wireless communication unit 200 contains antenna 202, preferably coupled to a duplex filter or antenna switch 204 that provides isolation between receive and transmit chains within the wireless communication unit 200.

The receiver chain, as known in the art, includes receiver front-end circuitry 206 (effectively providing reception, filtering and intermediate or base-band frequency conversion). The front-end circuitry 206 is serially coupled to a signal processing module 208. An audio output from the signal processing module 208 is provided to a suitable audio output device, which for the illustrated example comprises programmable gain amplifier circuitry 210 for amplifying an audio signal provided to speaker 215. In accordance with examples of the present invention, the wireless communication unit 200 comprises gain control module 230 arrange to control a gain applied to an audio signal by, for the illustrated example, programmable gain amplifier circuitry 210. The gain control module 230 is arranged to apply a gain step to a gain setting at defined time intervals, and upon detection of at least one zero crossing point within the audio signal, apply the gain setting to a gain control signal for controlling the gain applied to the audio signal.

For completeness, the receiver chain also includes received signal strength indicator (RSSI) circuitry 212, which in turn is coupled to a controller 214 that maintains overall subscriber unit control. The controller 214 may therefore receive bit error rate (BER) or frame error rate (FER) data from recovered information from RSSI circuitry 212, dependent upon the received signal level, and control the operation of any circuitry that may process received signals in response thereto. The controller 214 is also coupled to the receiver front-end circuitry 206 and the signal processing module 208 (generally realised by a digital signal processor (DSP)). The controller 214 is also coupled to a memory device 216 that selectively stores operating regimes, such as decoding/encoding functions, synchronisation patterns, code sequences, and the like. A timer 218 is operably coupled to the controller 214 to control the timing of operations (transmission or reception of time-dependent signals) within the wireless communication unit 200. In some examples, the timer 218 may be configured to provide appropriate control of signal timing to allow a gain step (increase or decrease) to be applied to a signal at defined time intervals.

As regards the transmit chain, this essentially includes an input device 220, such as a keypad, coupled in series through transmitter/modulation circuitry 222 and a power amplifier 224 to the antenna 202. The transmitter/modulation circuitry 222 and the power amplifier 224 are operationally responsive to the controller 214. The signal processor module 208 in the transmit chain may be implemented as distinct from the processor in the receive chain. Alternatively, a single processor may be used to implement processing of both transmit and receive signals, as shown in FIG. 2. Clearly, the various components within the wireless communication unit 200 can be realised in discrete or integrated component form, with an ultimate structure therefore being merely an application-specific or design selection.

Figure 3:
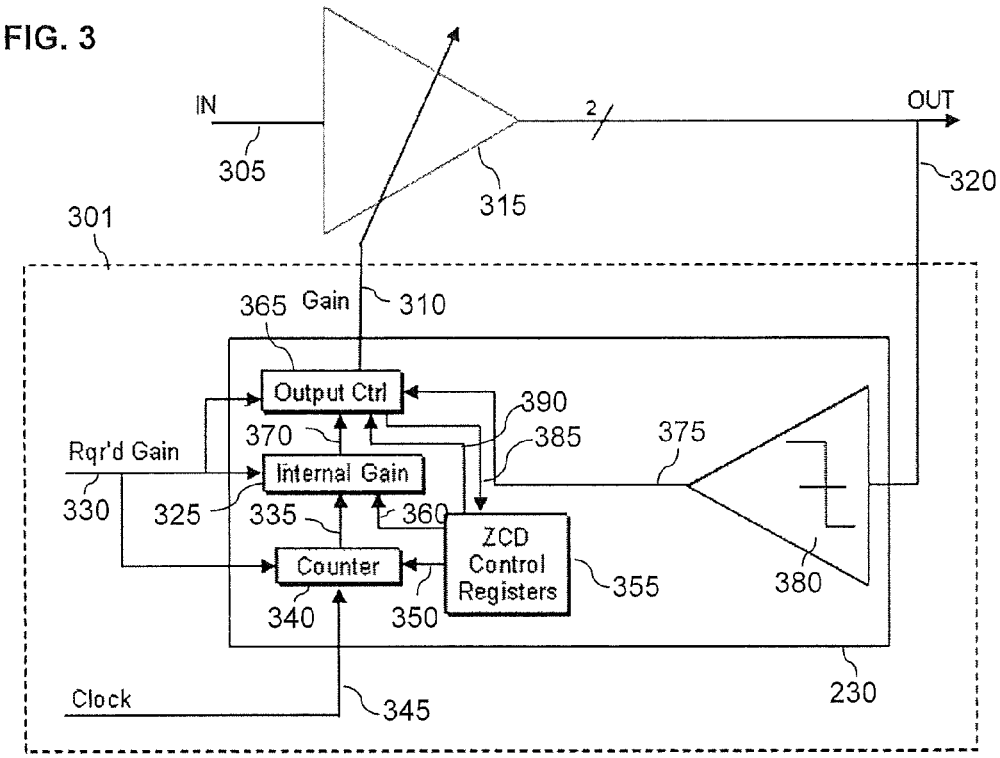
FIG. 3 illustrates an example of a gain control module.

Referring now to FIG. 3, there is illustrated an example of gain control module 230 according to some examples of the present invention, such as may be used to implement gain control module of FIG. 2. The gain control module 230 of FIG. 3 is arranged to control a gain applied to analogue audio signal 305. In particular for the illustrated example, the gain control module 230 is arranged to provide a gain control signal 310 to a programmable gain amplifier 315, whereby the programmable gain amplifier 315 applies a gain to (amplify or attenuate) the input audio signal 305 based on the received gain control signal 310, and outputs an amplified version of the audio signal 320.

For the illustrated example, the gain control module 230 forms a part of an integrated circuit device 301, and comprises gain setting circuitry 325 arranged to apply a gain step (increase or decrease) to an internal gain setting at defined time intervals. In particular, the gain setting circuitry 325 is arranged to receive an indication of a required gain 330, and upon receipt of a gain step signal 335, which for the illustrated example is received from timer circuitry 340, to compare the internal gain setting to the required gain. If the internal gain setting is not equal to the required gain, the gain setting circuitry 325 is arranged to apply a gain step to the internal gain setting. For example, if the internal gain setting is less than the required gain, the gain setting circuitry 325 applies a gain step to increase the internal gain setting. Conversely, if the internal gain setting is greater than the required gain, the gain setting circuitry 325 applies a gain step to decrease the internal gain setting.

For the illustrated example, the timer circuitry 340 is arranged to output a gain step signal 335 upon expiration of a timing signal, thereby providing gain step signals 335 at time intervals, which may be of a defined, uniform duration. In particular, the timer circuit 340 comprises a counter arranged to receive as inputs a clock signal 345 and an indication of a gain step interval value 350, which for the illustrated example is received from a control register 355. The counter of timer circuitry 340 is further arranged to count edges within the clock signal 345, for example rising and/or falling clock edges, and to output a gain step signal upon the number of counted edges reaching the gain step interval value 350. The indication of the gain step interval value 350 may comprise an actual gain step interval value, or may comprise a reference to, say, one of a set of gain step interval values. For example, the counter of timer circuitry 340 may be arranged to select one of four gain step interval values based on a two-bit binary gain step interval value indication 350. Upon outputting a gain step signal, the timer circuitry 340 may then reset itself for timing the next gain step interval.

As illustrated in FIG. 3, the timer circuitry 340 may be further arranged to receive as an input the indication of the required gain 330. In this manner, the timer circuitry 340 may be arranged to reset/initialise its counter when the indication of the required gain 330 changes. As a result, gain step signals 335 will be generated at substantially defined intervals of time following a change in the indication of the required gain 330. In accordance with some examples, such resetting/initialisation of the counter may be inhibited if the gain control module is in the middle of a gain ramp (e.g. if the internal gain setting is not equal to the required gain) when a change in the indication of the required gain 330 is received.

For the illustrated example, the gain setting circuitry 325 is further arranged to receive as an input an indication of a gain step size value 360, which for the illustrated example is received from a control register 355, and to apply a gain step to the internal gain setting, where the gain step comprises a step size corresponding to the received gain step size value indication 360. In the same manner as for the gain step interval value 350, the indication of the gain step size value may comprise an actual gain step size value, or may comprise a reference to, say, one of a set of gain step size values. For example, the gain setting circuitry 325 may be arranged to select one of four gain step size values based on a two-bit binary gain step size value indication 360.

The control registers 355 may be programmable, for example via a signal processing function, such as the signal processor module 208 illustrated in FIG. 2. In this manner, the gain step interval value 350 and/or the gain step size value may be configurable in order to vary the ramp up/down rates achieved by the gain control module 230. For example, it may be desirable/required to speed up ramping in volume for DTMF (Dual-Tone Multi-Frequency) audio signals, whilst being desirable/required to slow down the ramping in volume for music audio signals such as MP3 (MPEG-1 Audio Layer 3) playback, and the like.

The gain control module 230 further comprises an output control module 365, to which the gain setting circuitry 325 is arranged to provide an indication of the internal gain setting, as illustrated at 370. The output control module 365 is arranged to output the gain control signal 310 for controlling a voltage or current gain applied to the audio signal 305. For the illustrated example, the output control module 365 is arranged to receive as inputs the indication of the internal gain setting 370 and a zero crossing point detection signal 375, and upon a zero crossing point being detected within the audio signal (as indicated within the zero crossing point detection signal 375), to apply the internal gain setting to the gain control signal 310.

For the illustrated example, the audio signal 305, 320 comprises a differential signal and the gain control module 230 comprises a comparator 380 arranged to receive as an input the differential audio signal, specifically for the illustrated example the amplified version of the audio signal 320, and perform a comparison of the differential components of the audio signal 320. The comparator 380 outputs an indication of a polarity of the result of the comparison between the differential components of the audio signal 320. This indication of a polarity of the result of the comparison between the differential components of the audio signal 320 is provided to the output control module 365 as the zero crossing point detection signal 375. The output control module 365 is then able to interpret the zero crossing point detection signal 375, in order to detect a change from a positive polarity to a negative polarity, and vice versa, in order to detect a zero crossing within the audio signal 320.

Figure 4:
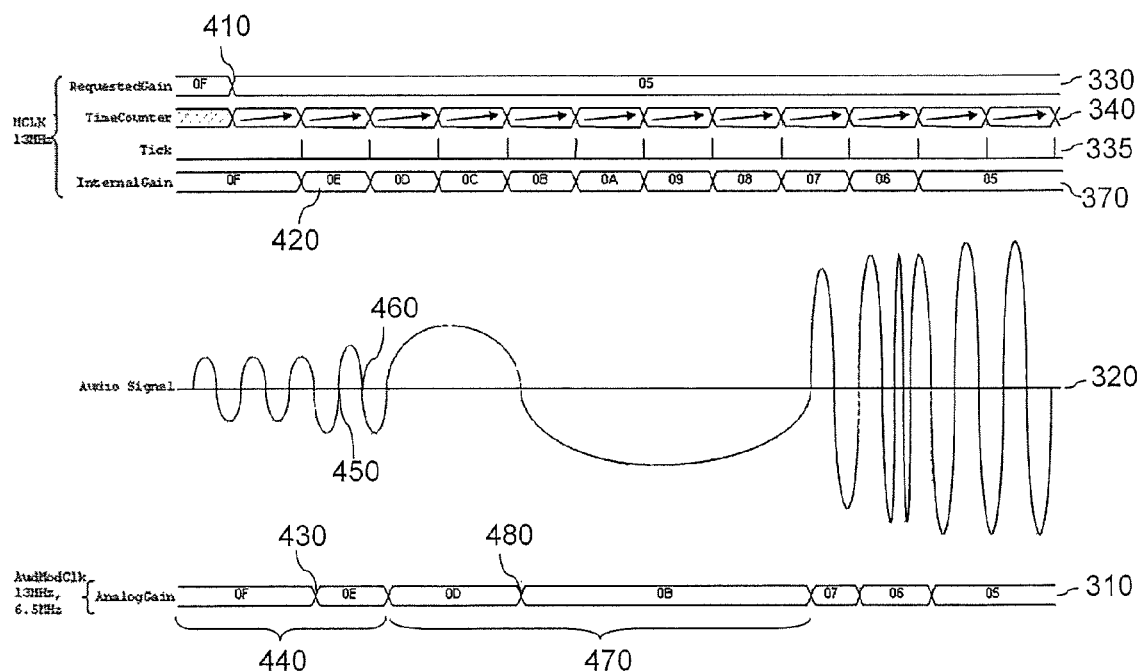
FIG. 4 illustrates an example of signal timings and gain values employed by the gain control module of FIG. 3

Referring now to FIG. 4, there is illustrated an example of signal timings and values for the gain control module 230 of FIG. 3 according to some example embodiments of the present invention. The required (requested) gain indication, as provided to gain setting circuitry 325, is illustrated at 330. For the illustrated example, the required gain indication comprises an initial hexadecimal value of '0F'. The gain control signal, output by an output control module 365 of FIG. 3, is illustrated at 310 and comprises an initial value equal to the initial required gain indication value 330 of '0F'. The audio signal to which a gain is applied is illustrated at 320, and comprises an initial gain corresponding to the initial gain control signal value of '0F'.

At timing point 410, the required gain indication 330 changes from a value of '0F' to a value of '05'. Upon detection of such a change in the required gain indication 330, the timer circuitry 340 is initialised and begins cyclically counting clock edges and outputting a gain step signal 335 (illustrated as 'ticks' in FIG. 4) upon the number of counted edges reaching the gain step interval value 350 received from the control register 355. In this manner, the timer 340 outputs gain step signals 335 at time intervals that may comprise a defined, uniform duration.

Upon receipt of a gain step signal 335, the gain setting circuitry 325 compares the current internal gain setting value 370 to the required gain indication value 330 and determines that, for the illustrated example, the internal gain setting is required to be increased. Thereafter, the gain setting logic 325 applies an increasing gain step to the internal gain setting 370. In this manner, the internal gain setting 370 is incremented at regular time intervals each time the gain setting circuitry 325 receives a gain step signal 335, starting at timing point 420 and continuing until the value of the internal gain setting 370 equals the required gain indication value 330.

As previously mentioned, the output control module 365 is arranged to apply the gain setting 370 to the gain control signal 310 upon a zero crossing point being detected within the audio signal 320. Accordingly, following the gain setting circuitry 325 applying the first gain step to the internal gain setting 370 at timing point 420, upon the next detection of a zero crossing point within the audio signal 320, the output control module 365 applies the gain setting 370 to the gain control signal 310, as indicated at point 430, causing the gain applied to the audio signal 320 to be increased to correspond to the internal gain setting 370 at that point in time.

For the period of time indicated generally at 440, the audio signal 320 comprises a relatively high frequency such that zero crossing points within the audio signal occur more frequently than the gain step signals 335 generated by the timing circuitry 340. Accordingly, for the next two detected zero crossing points 450, 460 of the illustrated example, the internal gain setting 370 is unchanged, and as such the gain applied to the audio signal 320 remains unchanged during those detected zero crossing points 450, 460. In this manner, when the audio signal comprises such a relatively high frequency, the gain of the audio signal 320 is incremented by a single step size at time intervals of durations that approximate the intervals of the gain step signals 335, irrespective of the number of zero crossings detected in between. Thus, for a high frequency audio signal a generally predictable ramp time can be achieved that is for the most part independent of the specific frequency of the audio signal.

Conversely, for the period of time indicated generally at 470, the audio signal 320 comprises a lower frequency, such that zero crossing points occur less frequently than the gain step signals 335 generated by the timing circuitry 340. As a result, more than one gain step signal 335 may be generated by the timing circuitry 340 between two consecutive zero crossing points within the audio signal 320. However, due to the fact that the gain setting circuitry 325 applies gain steps to the internal gain setting independently of the gain control signal 310, and of audio signal characteristics (e.g. zero crossing points), the internal gain setting is able to maintain a predictable ramp time, irrespective of the frequency of the audio signal 320. Accordingly, for the period of time indicated generally at 470, the gain setting circuitry 325 applies more than one gain step to the internal gain setting between zero crossing points within the audio signal 320, thereby maintaining the required gain ramp for the internal gain setting value 370. As a result, upon detection of the next zero crossing point within the audio signal 320, illustrated at point 480, the output control module 365 applies the internal gain setting value 370, which for the illustrated example has had two gain steps applied thereto since the previous zero crossing point, to the gain control signal 310. In this manner, the gain applied to the audio signal 320 is increased by two gain step sizes, in order to take into account the two instances of the gain setting circuitry 325 applying a gain step to the internal gain setting since the previous zero crossing point within the audio signal 320. Thus, when the audio signal 320 comprises such a relatively low frequency, although the gain of the audio signal 320 may be incremented less often than the internal gain setting value 370, it may be incremented with increased gain step sizes that take into account the more frequent internal gain setting increments. This maintains a generally predictable overall gain ramp time that is, for the most part, independent of the specific frequency of the audio signal.

Figure 1:
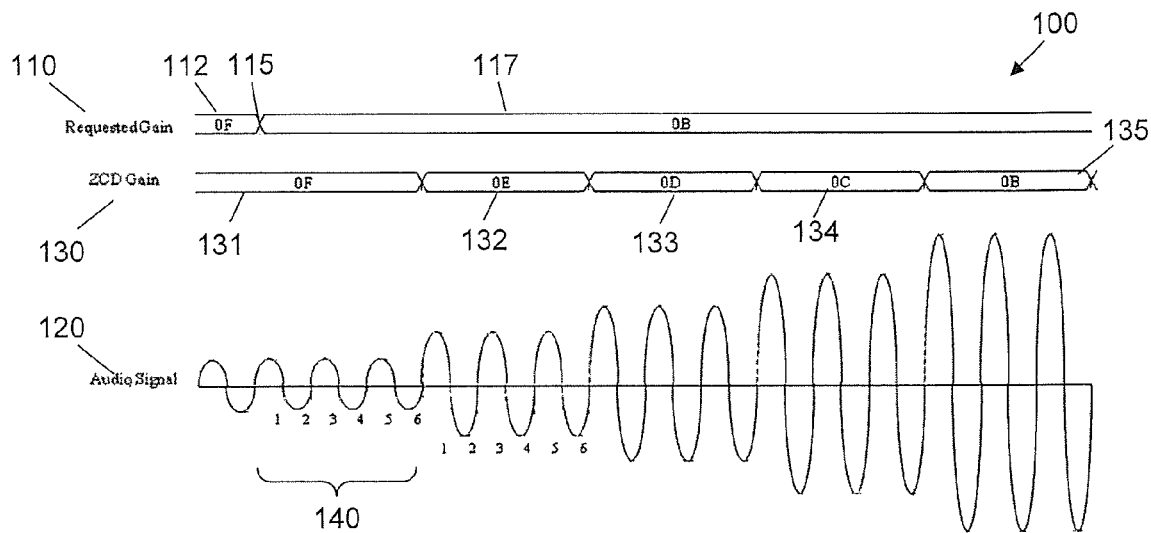
FIG. 1 illustrates an example of a known technique for controlling the gain of an audio signal.

The gain control module 230 illustrated in FIG. 3 provides an advantage over the prior art technique for controlling the gain applied to an audio signal, illustrated in FIG. 1, of the overall ramp up/down time being, for the most part, independent of the frequency of the audio signal. As such, the overall ramp time required for changing the gain applied to the audio signal may be substantially consistent and predictable, irrespective of the frequency of the audio signal.

An example of an application in which such consistent and predictable ramp time is particularly beneficial, if not necessary, is in implementing DTMF (Dual-Tone Multi-Frequency) specifications. The DTMF specifications require audio signals to be able to ramp up from mute to full volume within a limited period of time, which for lower frequency signals using the prior technique of FIG. 1 was difficult to achieve, and the discrepancy in the latency of the ramp up from mute to full volume for the technique of FIG. 1 being audibly noticeable. By way of example, Table 1 below illustrates DTMF keypad frequencies as applied to a typical mobile telephone handset keypad.

TABLE 1

| (DTMF) Dual-Tone Multi-Frequency Keypad Frequencies | | | | |
|---|---|---|---|---|
| | 1209 Hz | 1336 Hz | 1477 Hz | 1633 Hz |
| 697 Hz | 1 | 2 | 3 | A |
| 770 Hz | 4 | 5 | 6 | B |
| 852 Hz | 7 | 8 | 9 | C |
| 941 Hz | * | 0 | # | D |

The lowest signal in Table 1 is 697 Hz. This gives a zero crossing every 0.7 msec. For the prior art technique illustrated in FIG. 1, in a typical application the ramp up from mute to full volume requires, say, 31 gain steps, providing a worst case ramp up time of 21.7 msec. (0.7 msec.*31 steps). Conversely, for a signal comprising a frequency of 1633 Hz, zero crossing points occur every 0.3 msec. Thus, for the prior art technique of FIG. 1, in a typical application the ramp up time for such a signal would be 9.3 msec. As can be seen, the prior art technique results in a 12.4 msec. ramp time difference between the two signals. A further drawback of the known technique is that, if an increase to the worst case ramp up time is desired, it may only be achieved by setting gain steps to be applied every two zero crossings instead of every one zero crossing. This would result in a ramp up time of 43.3 msec. for the 697 Hz signal, as opposed to a 21.7 msec. ramp time. Significantly, it is not possible to achieve an intermediate ramp up time.

For the example of gain control illustrated in FIGS. 3 and 4 according to exemplary embodiments of the invention, if the gain step interval (i.e. the interval between gain step signals 335) is configured to, say, 1 ms and the gain step size is configured to, say, '1' such that 31 gain steps are required to be applied to ramp up from mute to full volume, then a worst case delay from mute to full volume for the internal gain setting value 370 would be 31 msec (1 msec*31 steps). Accordingly, since the worst case latency between the internal gain setting 370 reaching full volume and the internal gain setting value 370 being applied to the audio signal 320 is a single zero crossing period (0.7 msec.), the absolute worst case delay for the audio signal to ramp from mute to full volume would be 31.7 msec.

Notably, if gain step size is increased to '8', then the number of gain steps required to ramp from mute to full volume is reduced to '4', and as a result the worst case delay from mute to full volume for the internal gain setting value 370 is reduced to 4 ms (1 ms*4 steps). Thus, the absolute worst case delay for the audio signal to ramp from mute to full volume would be reduced to 4.7 ms.

For the audio signal comprising a frequency of 1633 Hz, the ramp up time from mute to full volume for the internal gain setting value 370 with a gain step size of '1' would also be 31 msec., since it is independent of the frequency of the audio signal. For completeness, since the worst case latency is a single zero crossing period (0.3 msec. in this case) between the internal gain setting 370 reaching full volume and the internal gain setting value being applied to the audio signal 320, the absolute worst case delay for the audio signal to ramp from mute to full volume would be 31.3 msec. However, taking the case where the next zero crossing occurs substantially immediately upon the internal gain setting value 370 reaching full volume, the worst case difference between the ramp up times for these two signals is therefore 0.7 msec. (31.7 msec.–31 msec.), which is significantly less than that for the prior art technique.

Referring back to FIG. 3, it is contemplated that, in order to provide noise tolerance, zero crossing points caused by noise are ignored when applying the internal gain setting 370 to the gain control signal 310. For example, any signal comprising a frequency outside of the audio range (for example greater than 20 kHz) may be assumed to be noise. Accordingly, for the illustrated example, the output control module 365 may be arranged to disregard zero crossing points occurring within a defined minimum time interval since a previously regarded zero crossing point, for example such that zero crossing point resulting from a signal that comprises a frequency outside an audio range are disregarded.

It is further contemplated that if no zero crossing points are detected over a defined period of time, say 30 ms, for example when the audio signal comprises silence (e.g. as may be the case when the signal has been muted), the gain control module 230 may be arranged, upon a gain change being required, to apply a gain step to the gain control signal 310 at defined time intervals, without waiting for a zero crossing point to be detected.

For example, the output control module 365 may comprise a zero crossing point detection timer (not shown) arranged to count down over a defined period of time. The timer is reset upon detection of a zero crossing point such that, upon expiration of the timer, it may be assumed that no zero crossing points have been detected within the timer countdown period. The output control module 365 may accordingly be arranged, upon expiration of the zero crossing point detection timer, to apply the gain setting value 370 directly to the gain control signal 310, without waiting for a zero crossing point to be detected. In this manner, gain steps are applied at defined intervals to the gain control signal 310 as they are applied to the internal gain setting value 370.

It is contemplated that the output control module 365 may be arranged, upon expiration of the zero crossing point detection timer, to reconfigure the gain step interval value 350 (and/or the gain step size value 360) within the control registers 355 in order to configure a 'SILENT MODE' gain step interval (and/or size), as indicated generally at 385. It is further contemplated that the output control module 365 may be arranged to receive from the control registers a zero crossing point detection timer value for configuring the period of time over which the zero crossing point detection timer counts down, as indicated generally at 390. In this manner, the period of time within which no zero crossing points are detected before the gain control module enters such a 'SILENT MODE' may be configurable by, for example, a signal processing function such as the signal processor module 208 of FIG. 8. The output control module 365 may further receive from the control registers a gain step interval value and/or a gain step size value to be used to configure the 'SILENT MODE' gain step interval and/or gain step size as described above. In this manner, such 'SILENT MODE' gain step interval and/or gain step size may also be configurable by, say, the signal processor module 208.

It is still further contemplated that the gain control module 230 may be arranged, upon receipt of a bypass signal, to apply the required gain, as indicated by the required gain indication 330, directly to the gain control signal 310, substantially bypassing the internal gain setting and the application of gain steps thereto.

For example, the output control module 365 may be arranged to receive a bypass value from control registers 355, and to also receive the indication of the required gain 330. Accordingly, when a bypass value is set within control registers 355 indicating that bypass functionality should be applied, for example by a signal processing module such as signal processor module 208 of FIG. 2, the output control module 365 may be arranged to apply the indicated required gain 330 to the gain control signal 310. The output control module 365 may apply the required gain to the gain control signal 310 substantially immediately upon receipt of the bypass signal, or alternatively upon detection of the next zero crossing point within the audio signal. In this manner, the gain applied to the audio signal may be increased or decreased to the required gain level substantially immediately. Significantly, whilst the output control module 365 is functioning in such a bypass mode, the timer circuitry 340 continues to generate gain step signals 335, and gain setting circuitry 325 continues to apply gain steps to the internal gain setting upon receipt of each gain step signal 335. In this manner, the internal gain setting value 370 continues to be incremented or decremented as required by the required gain indication 330. When the bypass value in the control registers 355 is subsequently set to indicate that the bypass functionality should be de-activated, the output control module 365 may revert back to normal operation comprising applying the gain setting value 370 to the gain control signal 310 upon detection of zero crossing points within the audio signal 320.

Figure 5:
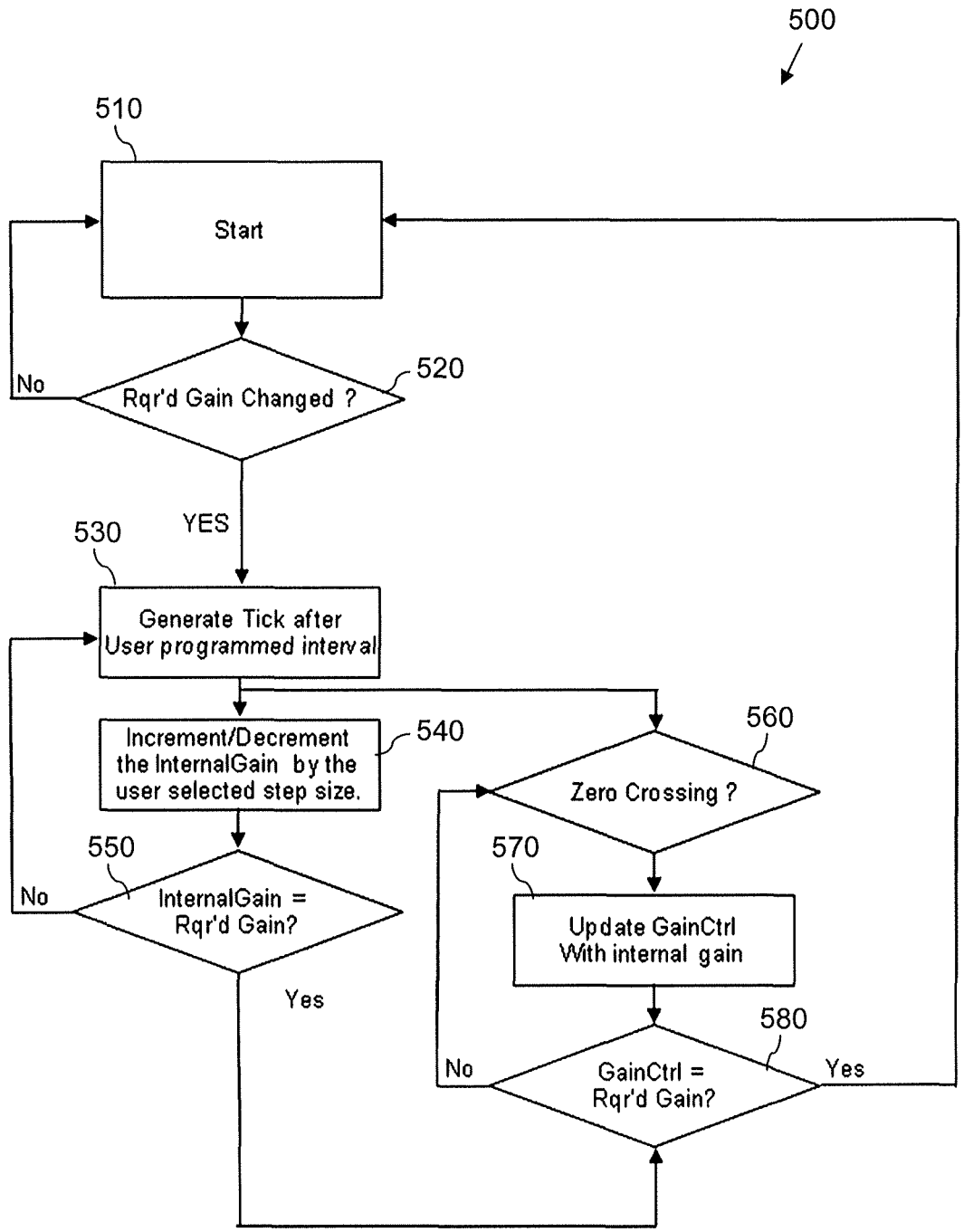
FIG. 5 illustrates an example of a simplified flowchart of a method for controlling a gain applied to an audio signal.

Referring now to FIG. 5 there is illustrated an example of a simplified flowchart 500 of a method for controlling a gain applied to an audio signal. In summary, the method comprises applying a gain step to a gain setting at defined time intervals, and upon detection of at least one zero crossing point within the audio signal, applying the gain setting to a gain control signal for controlling the gain applied to the audio signal. The method of FIG. 5 may be implemented as gain control module, such as that illustrated in FIG. 3. Alternatively, it is contemplated that the method of FIG. 5 may be implemented, at least partly, by way of executable program code running on signal processing functionality, such as the signal processor module 208 of FIG. 2.

The method starts at step 510, and moves on to step 520 where it is determined whether a change to a required gain has occurred. If it is determined that no change has occurred to the required gain, the method loops back to step 510. However, if it is determined that a change to the required gain has occurred, the method moves on to step 530, where a step gain signal (Tick) is generated after a defined time interval, which for the illustrated example may comprise a user programmable time interval. For the illustrated example, the method then branches.

Within a first branch, the method proceeds to step 540 where an internal gain setting is incremented or decremented as required by a gain step, which for the illustrated example may comprise a user selectable step size. The method moves on to step 550, where it is determined whether the internal gain setting is equal to the required gain setting. If the internal gain setting is not equal to the required gain setting, the method loops back to step 530. However, if it is determined that the internal gain setting has reached the required gain setting, the first branch ends by feeding into step 580.

Referring back to the method branching after step 530, within the second branch, the method proceeds to step 560, where the method waits for a zero crossing point to be detected. Upon a zero crossing point being detected, the method moves on to step 570, where a gain control signal is updated by applying a current internal gain setting to the gain control signal. The method then moves on to step 580 where it is determined whether the gain control signal is equal to the required gain setting. If it is determined that the gain control signal is not equal to the required gain setting, the method loops back to step 560. However, if it is determined that the gain control signal has reached the required gain setting, the method loops back to step 510.

Figure 6:
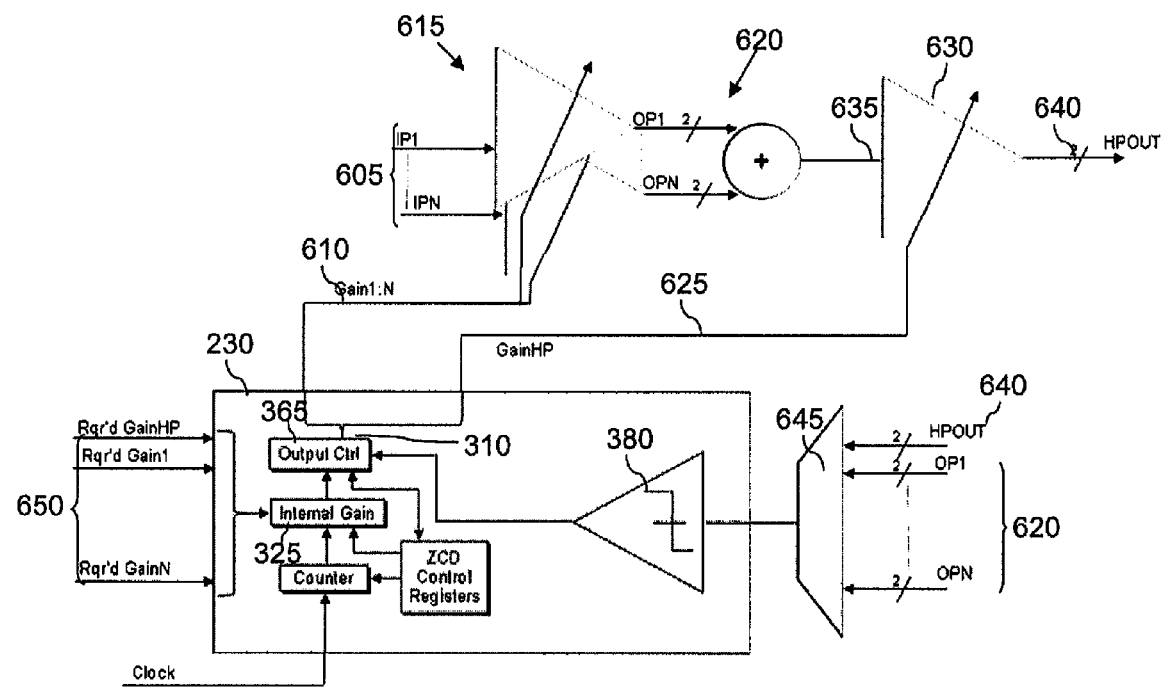
FIG. 6 illustrates a further example of a gain control module.

Referring now to FIG. 6 there is illustrated an example of a gain control module 600 according to some alternative example embodiments of the invention. For the example illustrated in FIG. 6, the gain control module 600 is arranged to control gain applied to a plurality of audio signals. In particular for the illustrated example the gain control module 600 is arranged to provide gain control signals 610 to input programmable gain amplifiers 615, which are arranged to receive individual input audio signals 605, to amplify the input audio signals 605, and to output individual amplified audio signals 620. The gain control module 600 is further arranged to provide a further gain control signal 625 to output programmable gain amplifier 630, which is arranged to receive a combined audio signal 635 comprising the combined amplified audio signals 620, and to output an amplified combined audio signal 640.

The individual amplified audio signals 620 and the amplified combined audio signal 640 are provided to inputs of a multiplexer 645, which is arranged to output a selected one of the inputted audio signals 320, 640, and to provide the selected audio signal to the comparator 380 of the gain control module 600. In this manner, the comparator 380 is arranged to detect zero crossing points within the selected audio signal.

The gain setting circuitry 325 is arranged to receive a selected indication of a required gain from a plurality of required gain indications 650, for example one associated with each of the programmable gain amplifiers 615, 630, the selected indication of a required gain being associated with the selected audio signal. For example, the required gain indications 650 may be provided to a multiplexer (not shown), which may be arranged to output a selected one of the required gain indications 650.

The output control module 365 is arranged to output a gain control signal 310 for the selected audio signal, and corresponding to the selected required gain indication. The gain control signal 310 output by the output control module 365 is then applied as the appropriate gain control signal 610, 625, for example by way of the multiplexer (not shown).

Thus, in this manner, the gain control module 600 arrangement illustrated in FIG. 6 is arranged to control the gain of the plurality of audio signals.

A skilled artisan will appreciate that in other applications, alternative functions/circuits/devices/components and/or other techniques may be used to implement the various functional operations herein described. In some examples, some or all of the steps illustrated in the flowchart 500 of FIG. 5 may be implemented in hardware and/or some or all of the steps illustrated in the flowchart may be implemented in software.

Thus, the hereinbefore examples provide a gain control apparatus for use in audio devices. In particular, the hereinbefore examples of apparatus and methods are capable of applying a substantially consistent and predictable gain ramp to an audio signal.

Although some aspects of the invention have been described with reference to their applicability to a wireless communication unit, it will be appreciated that the invention is not limited to this particular type of electronic device.

Figure 7:
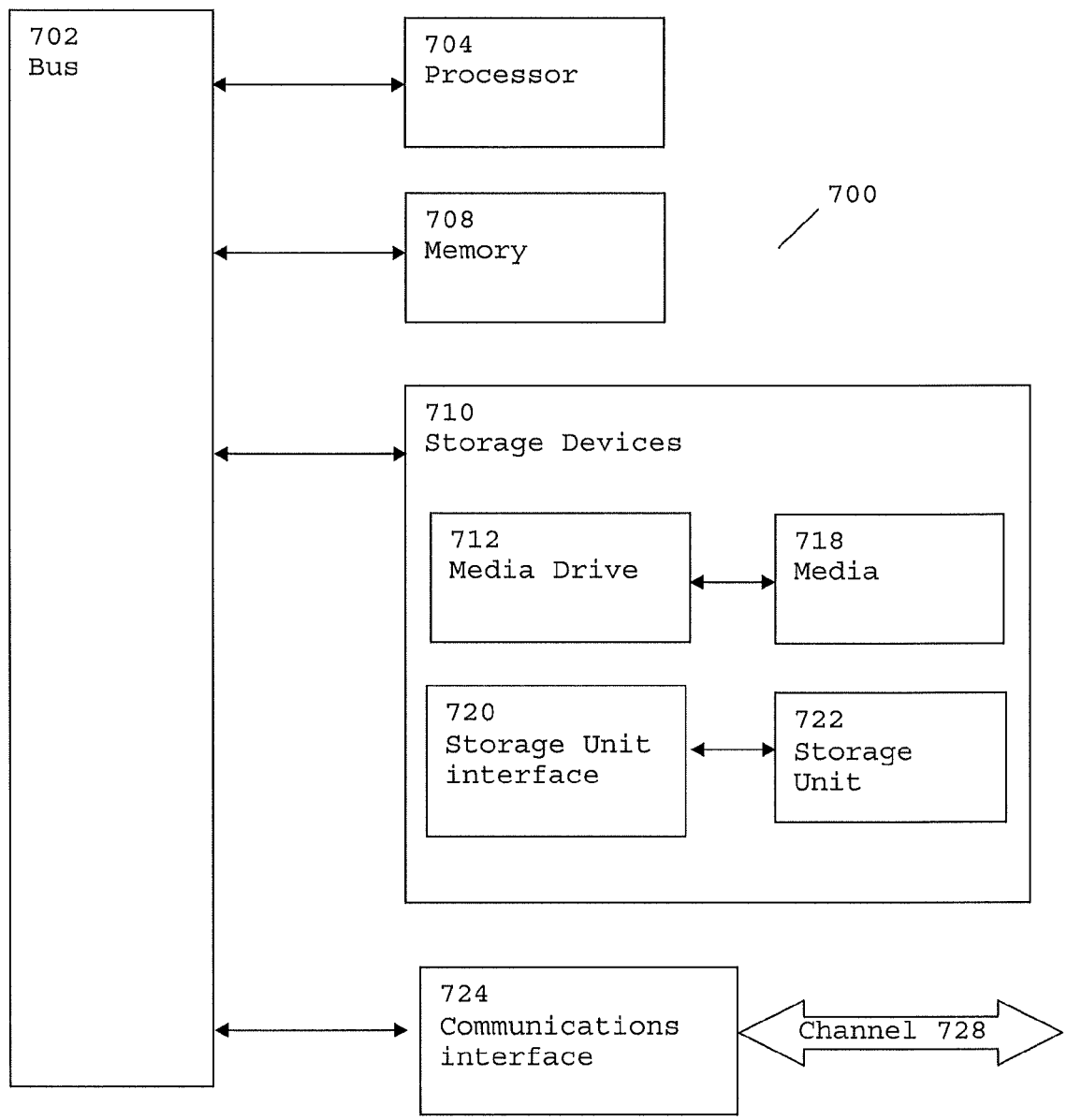
FIG. 7 illustrates a typical computing system.

Referring now to FIG. 7, there is illustrated a typical computing system 700 that may be employed to implement signal processing functionality in embodiments of the invention. Computing systems of this type may be used in access points and wireless communication units. Those skilled in the relevant art will also recognize how to implement the invention using other computer systems or architectures. Computing system 700 may represent, for example, a desktop, laptop or notebook computer, hand-held computing device (PDA, cell phone, palmtop, etc.), mainframe, server, client, or any other type of special or general purpose computing device as may be desirable or appropriate for a given application or environment. Computing system 700 can include one or more processors, such as a processor 704. Processor 704 can be implemented using a general or special-purpose processing engine such as, for example, a microprocessor, microcontroller or other control module. In this example, processor 704 is connected to a bus 702 or other communications medium.

Computing system 700 can also include a main memory 708, such as random access memory (RAM) or other dynamic memory, for storing information and instructions to be executed by processor 704. Main memory 708 also may be used for storing temporary variables or other intermediate information during execution of instructions to be executed by processor 704. Computing system 700 may likewise include a read only memory (ROM) or other static storage device coupled to bus 702 for storing static information and instructions for processor 704.

The computing system 700 may also include information storage system 710, which may include, for example, a media drive 712 and a removable storage interface 720. The media drive 712 may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media 718 may include, for example, a hard disk, floppy disk, magnetic tape, optical disk, CD or DVD, or other fixed or removable medium that is read by and written to by media drive 712. As these examples illustrate, the storage media 718 may include a computer-readable storage medium having particular computer software or data stored therein.

In alternative embodiments, information storage system 710 may include other similar components for allowing computer programs or other instructions or data to be loaded into computing system 700. Such components may include, for example, a removable storage unit 722 and an interface 720, such as a program cartridge and cartridge interface, a removable memory (for example, a flash memory or other removable memory module) and memory slot, and other removable storage units 722 and interfaces 720 that allow software and data to be transferred from the removable storage unit 718 to computing system 700.

Computing system 700 can also include a communications interface 724. Communications interface 724 can be used to allow software and data to be transferred between computing system 700 and external devices. Examples of communications interface 724 can include a modem, a network interface (such as an Ethernet or other NIC card), a communications port (such as for example, a universal serial bus (USB) port), a PCMCIA slot and card, etc. Software and data transferred via communications interface 724 are in the form of signals which can be electronic, electromagnetic, and optical or other signals capable of being received by communications interface 724. These signals are provided to communications interface 724 via a channel 728. This channel 728 may carry signals and may be implemented using a wireless medium, wire or cable, fiber optics, or other communications medium. Some examples of a channel include a phone line, a cellular phone link, an RF link, a network interface, a local or wide area network, and other communications channels.

In this document, the terms 'computer program product' 'computer-readable medium' and the like may be used generally to refer to media such as, for example, memory 708, storage device 718, or storage unit 722. These and other forms of computer-readable media may store one or more instructions for use by processor 704, to cause the processor to perform specified operations. Such instructions, generally referred to as 'computer program code' (which may be grouped in the form of computer programs or other groupings), when executed, enable the computing system 700 to perform functions of embodiments of the present invention. Note that the code may directly cause the processor to perform specified operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 700 using, for example, removable storage drive 722, drive 712 or communications interface 724. The control module (in this example, software instructions or computer program code), when executed by the processor 704, causes the processor 704 to perform the functions of the invention as described herein.

In particular, it is envisaged that the aforementioned inventive concept can be applied by a semiconductor manufacturer to any integrated circuit comprising an audio signal gain control module. It is further envisaged that, for example, a semiconductor manufacturer may employ the inventive concept in a design of a stand-alone device, or application-specific integrated circuit (ASIC) and/or any other sub-system element.

It will be appreciated that, for clarity purposes, the above description has described exemplary embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Aspects of the invention may be implemented in any suitable form including hardware, software, firmware or any combination of these. The invention may optionally be implemented, at least partly, as computer software running on one or more data processors and/or digital signal processors or configurable module components such as FPGA devices. Thus, the elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, an improved gain control module and method of operation therefor have been described, wherein the aforementioned disadvantages with prior art arrangements have been substantially alleviated.

The invention claimed is:

1. An integrated circuit comprising a gain control module for controlling a gain applied to an audio signal, the gain control module being arranged to:
  apply a gain step to a gain setting at defined time intervals, and
  upon detection of at least one zero crossing point within the audio signal, apply the gain setting to a gain control signal for controlling the gain applied to the audio signal;
  wherein the gain control module further comprises an output control module arranged to output a gain control signal for controlling the gain applied to the audio signal; the output control module is further arranged to:
    receive as inputs an indication of the gain setting and a zero crossing point detection signal; and
    upon a zero crossing point being detect within the audio signal, to apply the gain setting to the gain control signal.

2. The integrated circuit of claim 1 wherein the output control module is arranged to disregard zero crossing points occurring within a defined minimum time interval since a previously regarded zero crossing point.

3. The integrated circuit of claim 2 wherein the output control module is arranged to disregard zero crossing points occurring within a defined minimum time interval since a previously regarded zero crossing point such that zero crossing points resulting from a signal comprising a frequency outside an audio range are disregarded.

4. An electronic device comprising a gain control module for controlling a gain applied to an audio signal, the gain control module being arranged to:
apply a gain step to a gain setting at defined time intervals independently of characteristics of the audio signal; and
upon detect of at least one zero crossing point with the audio signal, apply the gain setting corresponding to a time the zero crossing point is detected to a gain control signal for controlling the gain applied to the audio signal,
wherein the gain control module further comprises an output control module arranged to output the gain control signal for controlling the gain applied to the audio signal; the output control module is further arranged to:
receive as inputs an indication of the gain setting and a zero crossing point detection signal; and
upon a zero crossing point being detected within the audio signal, to apply the gain setting to the gain control signal.

5. The integrated circuit of claim 1 wherein the gain control module is arranged to apply the gain step to the gain setting at time intervals comprising a defined, uniform duration.

6. The integrated circuit of claim 5 wherein the gain control module comprises timer circuitry, the timer circuitry being arranged, upon expiration of a timing signal, to output a gain step signal, and the gain control module is arranged to apply the gain step to the gain setting following the gain step signal being output by the timer circuitry.

7. The integrated circuit of claim 6 wherein the timer circuitry comprises a counter arranged to receive as inputs a clock signal and an indication of a gain step interval value, the counter being further arranged to count at least one of rising and falling edges of the received clock signal, and to output a gain step signal upon the number of counted edges of the received clock signal reaching the gain step interval value.

8. The integrated circuit of claim 6 wherein the gain control module further comprises gain setting circuitry arranged to receive an indication of a required gain, the gain setting circuitry being further arranged, upon receipt of the gain step signal, to compare the gain setting to the required gain.

9. The integrated circuit of claim 8 wherein if the gain setting is not equal to the required gain, the gain setting circuitry is arranged to apply the gain step to the gain setting.

10. The integrated circuit of claim 9 wherein the gain setting circuitry is arranged to receive as an input an indication of a gain step size value, and the gain step is applied to the gain setting at a step size corresponding to a received gain step size value indication.

11. The integrated circuit of claim 1 wherein if no zero crossing points are detected over a defined period of time, the gain control module is arranged to apply a gain step to the gain control signal at defined time intervals.

12. The integrated circuit of claim 11 wherein the gain control module may comprise an output control module arranged, upon expiration of a zero crossing point detection timer, to apply the gain setting directly to the gain control signal, without waiting for a zero crossing point to be detected.

13. The integrated circuit of claim 1 wherein the gain control module is arranged, upon receipt of a bypass signal, to apply a required gain directly to the gain control signal.

14. The integrated circuit of claim 13 wherein an output control module is arranged to receive the bypass signal and an indication of the required gain, and upon receipt of the bypass signal, to apply the required gain to the gain control signal.

15. The integrated circuit of claim 1 wherein the audio signal comprises a differential signal, and the gain control module comprises a comparator arranged to:
receive as an input the differential audio signal;
perform a comparison of differential components of the differential audio signal; and
output an indication of a detected zero crossing point upon a change in polarity of a result of the comparison between the differential components of the differential audio signal.

16. The integrated circuit of claim 1 wherein the gain control module is further arranged to control gain applied to a plurality of audio signals.

* * * * *